(12) United States Patent
Huangfu

(10) Patent No.: US 11,195,882 B2
(45) Date of Patent: Dec. 7, 2021

(54) PIXEL ARRANGEMENT STRUCTURE, DISPLAY SUBSTRATE AND DISPLAY DEVICE

(71) Applicant: BOE Technology Group Co., Ltd., Beijing (CN)

(72) Inventor: Lujiang Huangfu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/633,937

(22) PCT Filed: Jan. 11, 2019

(86) PCT No.: PCT/CN2019/071351
§ 371 (c)(1),
(2) Date: Jan. 24, 2020

(87) PCT Pub. No.: WO2020/143026
PCT Pub. Date: Jul. 16, 2020

(65) Prior Publication Data
US 2021/0074776 A1 Mar. 11, 2021

(51) Int. Cl.
*H01L 27/32* (2006.01)
(52) U.S. Cl.
CPC ........ *H01L 27/3218* (2013.01); *H01L 27/322* (2013.01); *H01L 27/3216* (2013.01)
(58) Field of Classification Search
CPC ..... H01L 27/3206–3218; H01L 27/322; H01L 27/3213; H01L 27/3216; G09G 2300/0452; G09G 2201/52
See application file for complete search history.

(56) References Cited

U.S. PATENT DOCUMENTS 5,113,274 A 5/1992 Takahashi et al.
6,950,115 B2 9/2005 Brown Elliott
(Continued)

OTHER PUBLICATIONS

Candice H. Brown Elliot, Reducing Pixel Count Without Reducing Image Quality, Information Display, vol. 1999(12):22~25, 1999.
(Continued)

*Primary Examiner* — Matthew C Landau
*Assistant Examiner* — Eric K Ashbahian
(74) *Attorney, Agent, or Firm* — Banner & Witcoff, Ltd.

(57) ABSTRACT

A pixel arrangement structure, a display substrate and a display device. The pixel arrangement structure includes: a plurality of first sub-pixels and a plurality of sub-pixel groups arranged in an array, wherein the plurality of first sub-pixels and the plurality of sub-pixel groups are alternately arranged along a first direction to form pixel rows, and are alternately arranged along a second direction intersected with the first direction to form pixel columns; each of the plurality of sub-pixel groups includes a second sub-pixel, a third sub-pixel and another second sub-pixel sequentially arranged along the first direction; in the same pixel row, a ratio of a distance between the geometric centers of each second sub-pixel and the adjacent third sub-pixel to a distance between the geometric centers of each first sub-pixel and the third sub-pixel in the adjacent sub-pixel group is greater than or equal to ¼ and less than ½.

16 Claims, 4 Drawing Sheets

(56) References Cited

U.S. PATENT DOCUMENTS

| | | | |
|---|---|---|---|
| 2005/0134600 A1* | 6/2005 | Credelle | G09G 3/3607 345/589 |
| 2014/0183484 A1* | 7/2014 | Moon | H01L 51/5203 257/40 |
| 2016/0240594 A1* | 8/2016 | Zhu | H01L 27/3218 |
| 2017/0069697 A1* | 3/2017 | Hashimoto | H01L 27/3246 |
| 2017/0091903 A1* | 3/2017 | Jo | G06T 3/4069 |
| 2018/0227540 A1* | 8/2018 | Stolitzka | G09G 3/2003 |
| 2020/0005709 A1* | 1/2020 | Kim | H01L 27/3218 |
| 2020/0058245 A1* | 2/2020 | Cui | G09G 3/2003 |

OTHER PUBLICATIONS https://en.wikipedia.org <https://protect-us.mimecast.com/s/29x0CDkwRxiBLAwMFWDL74> "PenTile Matrix Family".

\* cited by examiner

PIXEL ARRANGEMENT STRUCTURE, DISPLAY SUBSTRATE AND DISPLAY DEVICE

The application is a U.S. National Phase Entry of International Application No. PCT/CN2019/071351 filed on Jan. 11, 2019, designating the United States of America. The present application claims priority to and the benefit of the above-identified application and the above-identified application is incorporated by reference herein in its entirety.

TECHNICAL FIELD

Embodiments of the present disclosure relate to a pixel arrangement structure, a display substrate and a display device.

BACKGROUND

With the continuous development of display technology, people have gained higher and higher requirements for the resolution of display devices. Due to the advantages of high display quality, the application range of high-resolution display devices have become wider and wider. In general, the resolution of a display device can be improved by reducing the size of pixels and reducing the spacing between pixels. However, the reduction in the size of pixels and the spacing between pixels also lead to higher and higher requirements for the precision of the manufacturing process, which results in the increase in the difficulty and cost of the manufacturing process of the display device.

On the other hand, the sub-pixel composition optimization technology and the sub-pixel rendering (SPR) technology for pixels, can change the mode of defining pixel simply by conventional red, green and blue sub-pixels, by taking advantage of the difference in resolution of different color sub-pixels by human eyes. By sharing resolution-insensitive color sub-pixels at some positions among different pixels, the same pixel resolution performance can be simulated by using a relatively small number of sub-pixels, thus reducing the difficulty and cost of the manufacturing process.

SUMMARY

At least one embodiment of the present disclosure provides a pixel arrangement structure, including: a plurality of first sub-pixels and a plurality of sub-pixel groups arranged in an array, wherein the plurality of first sub-pixels and the plurality of sub-pixel groups are alternately arranged along a first direction to form pixel rows, and are alternately arranged along a second direction intersected with the first direction to form pixel columns; each of the plurality of sub-pixel groups includes a second sub-pixel, a third sub-pixel and another second sub-pixel sequentially arranged along the first direction; geometric centers of the first sub-pixels, the second sub-pixels and the third sub-pixels in a same pixel row are located on a same straight line along the first direction; geometric centers of the first sub-pixels and the third sub-pixels in a same pixel column are located on a same straight line along the second direction; in the same pixel row, a ratio of a distance between the geometric centers of each second sub-pixel and the adjacent third sub-pixel to a distance between the geometric centers of each first sub-pixel and the third sub-pixel in the adjacent sub-pixel group is greater than or equal to ¼ and less than ½.

For example, in the pixel arrangement structure provided by an embodiment of the present disclosure, the geometric centers of four first sub-pixels adjacent to each of the plurality of sub-pixel groups are four vertices of a square or a quasi-square shape.

For example, in the pixel arrangement structure provided by an embodiment of the present disclosure, a size of each of the third sub-pixels in the first direction is ⅓-½ of a size of each of the plurality of sub-pixel groups in the first direction.

For example, in the pixel arrangement structure provided by an embodiment of the present disclosure, a size of each of the second sub-pixels in the second direction is the same as a size of each of the third sub-pixels in the second direction.

For example, in the pixel arrangement structure provided by an embodiment of the present disclosure, a size of each of the plurality of first sub-pixels in the second direction is ½-1 of a size of each of the plurality of sub-pixel groups in the second direction.

For example, in the pixel arrangement structure provided by an embodiment of the present disclosure, an area of each of the plurality of first sub-pixels is the same as an area of each of the plurality of sub-pixel groups, and an area of each of the second sub-pixels is the same as an area of each of the third sub-pixels.

For example, in the pixel arrangement structure provided by an embodiment of the present disclosure, an area of each of the plurality of first sub-pixels is ½ of an area of each of the plurality of sub-pixel groups, and an area of each of the third sub-pixels is the same as the area of each of the plurality of first sub-pixels.

For example, in the pixel arrangement structure provided by an embodiment of the present disclosure, an area of each of the second sub-pixels is ½ of the area of each of the third sub-pixels.

For example, in the pixel arrangement structure provided by an embodiment of the present disclosure, the first direction and the second direction are perpendicular to each other.

For example, in the pixel arrangement structure provided by an embodiment of the present disclosure, shapes of the first sub-pixel, the second sub-pixel and the third sub-pixel are all rectangular.

For example, in the pixel arrangement structure provided by an embodiment of the present disclosure, each of the first sub-pixels includes a red sub-pixel, each of the second sub-pixels includes a green sub-pixel, and each of the third sub-pixels includes a blue sub-pixel.

At least one embodiment of the present disclosure further provides a display substrate, including: a base substrate; and a pixel arrangement structure arranged on the base substrate; wherein the pixel arrangement structure includes the pixel arrangement structure provided by any one of the embodiments of the present disclosure.

For example, in the display substrate provided by an embodiment of the present disclosure, each of the first sub-pixels includes a first pixel electrode, each of the second sub-pixels includes a second pixel electrode, and each of the third sub-pixels includes a third pixel electrode.

For example, in the display substrate provided by an embodiment of the present disclosure, each of the first sub-pixels further includes a first color light emitting layer disposed on the first pixel electrode, each of the second sub-pixels further includes a second color light emitting layer disposed on the second pixel electrode, and each of the third sub-pixels further includes a third color light emitting layer disposed on the third pixel electrode.

For example, in the display substrate provided by an embodiment of the present disclosure, the display substrate is a color filter substrate, each of the first sub-pixels includes a first color filter layer, each of the second sub-pixels includes a second color filter layer, and each of the third sub-pixels includes a third color filter layer.

At least one embodiment of the present disclosure further provides a display device, including the display substrate provided by any one of the embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
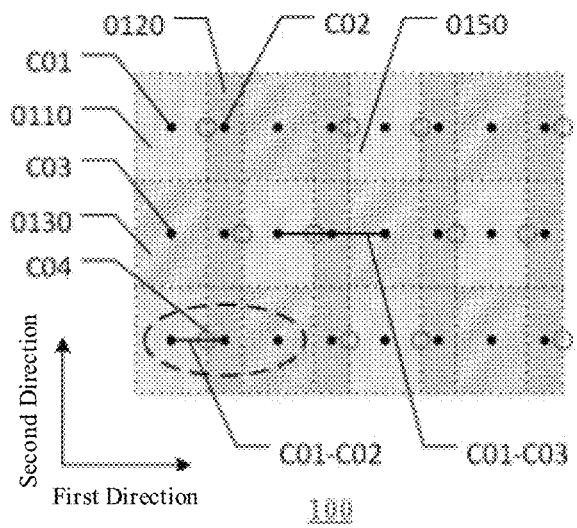
FIG. 1 is a schematic diagram of a pixel arrangement structure.

FIG. 1 is a schematic diagram of a pixel arrangement structure. As shown in FIG. 1, the pixel arrangement structure 100 adopts a typical sub-pixel composition optimization (virtual) pixel mode, namely RGBG-stripes, which includes: a plurality of first sub-pixel groups and a plurality of second sub-pixel groups arranged in an array, wherein the plurality of first sub-pixel groups and the plurality of second sub-pixel groups are alternately arranged in a first direction to form pixel rows, and are alternately arranged in a second direction intersected with the first direction to form pixel columns; each first sub-pixel group includes a red sub-pixel 0110 and a green sub-pixel 0120 arranged in sequence along the first direction, and each second sub-pixel group includes a blue sub-pixel 0130 and a green sub-pixel 0120 arranged in sequence along the first direction; in the second direction, the green sub-pixels are aligned with each other, and the red sub-pixels and the blue sub-pixels are alternately arranged and aligned with each other. These sub-pixels in the pixel arrangement structure is evenly distributed, and high PPI (Pixel Per Inch) display is easy to be realized.

In research, the inventors of the present application have noticed that: when displaying white balance, green G occupies about 63% of brightness, red R occupies about 32% of brightness, and blue B occupies about 5% of brightness (the specific proportion is related to white balance and primary color coordinates). Therefore, as shown by the elliptical dashed box in FIG. 1, in the pixel arrangement structure 100, the position of the grayscale center C04 presented by the red sub-pixel 0110, green sub-pixel 0120 and blue sub-pixel 0130 which are adjacent in the first direction is mainly determined by the position of the geometric center C02 of the green sub-pixel 0120, but may be influenced by the position of the geometric center C01 of the red sub-pixel 0110, while the influence of the position of the geometric center C03 of the blue sub-pixel 0130 can be approximately negligible. Specifically, the grayscale center C04 is located approximately on the geometric center connecting line C01-C02 of the red sub-pixel 0110 and the adjacent green sub-pixel 0120, and is located at a position having a distance of approximately ⅓ of the length of the geometric center connecting line C01-C02 from the geometric center C02 of the green sub-pixel 0120.

As shown in FIG. 1, the distribution of the grayscale centers C04 determined by the positions of the geometric centers C01, C02, C03 of the red sub-pixels 0110, the green sub-pixels 0120, and the blue sub-pixels 0130 in the pixel arrangement structure 100 is uneven. For example, in the first direction, the distance between adjacent grayscale centers has two values, wherein the distance between the two grayscale centers on both sides of the geometric center C01 of the red sub-pixel 0110 has a smaller value, and the distance between two grayscale centers on both sides of the geometric center C03 of the blue sub-pixel 0130 has a larger value. Therefore, when the pixel arrangement structure 100 presents a continuous white (gray) image/pattern, graininess (two adjacent grayscale centers close to each other are difficult to be distinguished and are combined into one by human vision) may occur when the relatively uniform region that mainly presents white (gray) component in the first direction has insufficient resolution, and non-smoothness may occur when fine lines are presented in the second direction, which are not conducive to improving the display quality The RGBG-stripes (virtual) pixel technology after adopting the above pixel arrangement structure 100 and SPR technology, compared with the typical RGB pixel arrangement structure, can reduce some red and blue sub-pixels under the same PPI, and reduce the manufacturing difficulty of the high PPI sub-pixel patterning process. However, the reduction of red and blue sub-pixels will cause the loss of (virtual) pixel performance capability and effect in RGBG-stripes (virtual) pixel technology. In addition to using appropriate SPR technology to make up for the loss, the pixel arrangement structure can also be improved so that the (virtual) pixel performance effect in RGBG-stripes (virtual) pixel technology is as close as possible to the red, green and blue pixel performance effect in RGB pixel arrangement structure.

In order to manufacture a display device with high resolution, it is necessary to reduce the size of pixels and the spacing between pixels. However, the reduction in the size of pixels and the spacing between pixels also lead to higher and higher requirements for the precision of the manufacturing process, which results in the increase in the difficulty and cost of the manufacturing process of the display device. For example, when manufacturing an active matrix organic light emitting diode (AMOLED) display device with high resolution, the manufacturing process for manufacturing an active matrix organic light emitting diode (AMOLED) display device with high resolution (for example, with a pixel density of more than 300 PPI) is difficult and the manufacturing cost is high, due to the limitation of the process precision of the fine metal mask (FMM) technology.

The embodiments of the present disclosure provide a pixel arrangement structure, which comprises: a plurality of first sub-pixels and a plurality of sub-pixel groups arranged in an array, wherein the plurality of first sub-pixels and the plurality of sub-pixel groups are alternately arranged along a first direction to form pixel rows, and are alternately arranged along a second direction intersected with the first direction to form pixel columns; each of the plurality of sub-pixel groups comprises a second sub-pixel, a third sub-pixel and another second sub-pixel sequentially arranged along the first direction; geometric centers of the first sub-pixel, the second sub-pixel and the third sub-pixel in a same pixel row are located on a same straight line along the first direction; geometric centers of the first sub-pixel and the third sub-pixel in a same pixel column are located on a same straight line along the second direction; in the same pixel row, a ratio of a distance between the geometric centers of the second sub-pixel and the adjacent third sub-pixel to a distance between the geometric centers of the first sub-pixel and the third sub-pixel in the adjacent sub-pixel group is greater than or equal to ¼ and less than ½. The embodiments of the present disclosure further provide a display substrate and a display device corresponding to the pixel arrangement structure.

In the pixel arrangement structure provided by the embodiments of the disclosure, the geometric centers of the second sub-pixels are set close to the geometric centers of the third sub-pixels, so that the distribution of grayscale centers is more uniform, the visual sense of graininess and non-smoothness are improved, and the display quality of the pixel arrangement structure is further improved.

The pixel arrangement structure, the display substrate, and the display device provided by the embodiments of the present disclosure will be described below with reference to the accompanying drawings. It should be noted that the same reference numerals in different drawings are used to refer to the same or similar structures already described.

Figure 2:
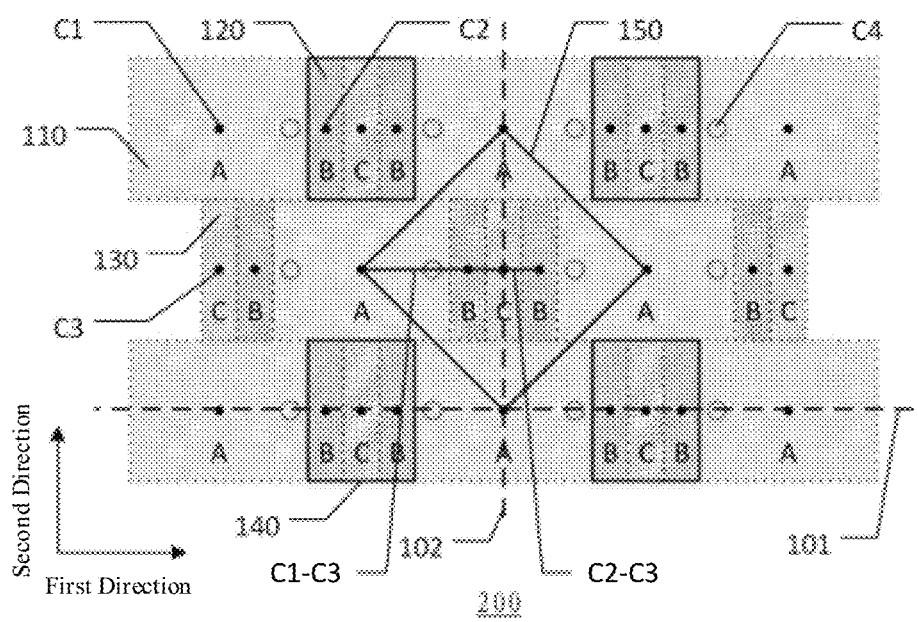
FIG. 2 is a schematic diagram of a pixel arrangement structure provided by an embodiment of the present disclosure.

At least one embodiment of the present disclosure provides a pixel arrangement structure. FIG. 2 is a schematic diagram of a pixel arrangement structure provided by an embodiment of the present disclosure. The pixel arrangement structure 200 includes a plurality of first sub-pixels 110 and a plurality of sub-pixel groups 140 arranged in an array. As shown in FIG. 2, the plurality of first sub-pixels 110 and the plurality of sub-pixel groups 140 are alternately arranged in a first direction to form pixel rows, and are alternately arranged in a second direction intersected with the first direction to form pixel columns. Each sub-pixel group 140 includes a second sub-pixel 120, a third sub-pixel 130, and another second sub-pixel 120 sequentially arranged along the first direction; geometric centers of the first sub-pixel 110, the second sub-pixel 120 and the third sub-pixel 130 in a same pixel row are located on a same straight line 101 along the first direction, and geometric centers of the first sub-pixel 110 and the third sub-pixel 130 in a same pixel column are located on a same straight line 102 along the second direction. In the same pixel row, a ratio of a distance L2 between the geometric centers of the second sub-pixel 120 and the adjacent third sub-pixel 130 (i.e., the length of the line segment C2-C3 in FIG. 2) to a distance L1 between the geometric centers of the first sub-pixel 110 and the third sub-pixel 130 in the adjacent sub-pixel group 140 (i.e., the length of the line segment C1-C3 in FIG. 2) is greater than or equal to ¼ and less than ½. For example, the ratio of L2 to L1 can be 0.3, 0.35, 0.4, 0.45, etc.

In the pixel arrangement structure 100 shown in FIG. 1, assuming that the red sub-pixel is the first sub-pixel, the green sub-pixel is the second sub-pixel and the blue sub-pixel is the third sub-pixel, the pixel arrangement structure 100 is similar to the pixel arrangement structure 200 except that: in the pixel arrangement structure 100, the ratio of L2 to L1 is equal to ½; while the pixel arrangement structure 200, the ratio of L2 to L1 is less than ½ and greater than or equal to ¼. Therefore, compared with the pixel arrangement structure 100, the pixel arrangement structure 200 sets the geometric centers of the second sub-pixels be closer to the geometric centers of the third sub-pixels, so that in the first direction, the distance of adjacent grayscale centers that originally has a smaller value will increase, and the distance of adjacent grayscale centers that originally has a larger value will decrease, thus making the distribution of grayscale centers more uniform, improving the visual sense of graininess and non-smoothness, and further improving the display quality of the pixel arrangement structure.

For example, FIG. 2 shows a case where the ratio of L2 to L1 is equal to ¼. In this case, in the first direction, the distance between adjacent grayscale centers has only one value, i.e., the grayscale centers are uniformly distributed in the first direction. If the ratio of L2 to L1 is less than ¼, the distribution of the grayscale centers in the first direction starts to become uneven again, and at the same time, the sizes of the second sub-pixel 120 and the third sub-pixel 130 in the first direction will also be reduced, thus the areas of the second sub-pixel 120 and the third sub-pixel 130 will be reduced. Therefore, for example, the service life of the second sub-pixel 120 and the third sub-pixel 130 in the AMOLED display device will be shortened, which is not conducive to prolonging the service life of the AMOLED display device.

For example, in some examples, as shown in FIG. 2, the geometric centers C1 of the four first sub-pixels 110 adjacent to each sub-pixel group 140 are four vertices of a square or quasi-square 150. Therefore, the spacing between the grayscale centers in the second direction can be made equal to or close to the spacing between the grayscale centers in the first direction, so that the distribution of the grayscale centers in the plane can be made more uniform. It should be noted that the square described here is a strict square, and the quasi-square refers to a rhombus with any corner floating up and down 5 degrees at right angles.

For example, in some examples, the size of each third sub-pixel 130 in the first direction can be ⅓-½ of the size of each sub-pixel group 140 in the first direction. For example, FIG. 2 shows a case where the size of each third sub-pixel 130 in the first direction is ⅓ of the size of each sub-pixel group 140 in the first direction. Therefore, the third sub-pixel 130 in the sub-pixel group 140 can have a relatively large area, so that the light emitting region of the third sub-pixel 130 can have a relatively large area, for example, in an AMOLED display device, which is beneficial to prolonging the service life of the third sub-pixel 130 (for example, the third sub-pixel 130 is a blue sub-pixel), and further prolonging the service life of the AMOLED display device.

For example, in some examples, as shown in FIG. 2, in the pixel arrangement structure 200, the size of each second sub-pixel 120 in the second direction is the same as the size of each third sub-pixel 130 in the second direction. For example, in some examples, the size of each second sub-pixel 120 in the second direction and the size of each third sub-pixel 130 in the second direction can be the same as the size of each sub-pixel group 140 in the second direction. Therefore, the second sub-pixel 120 and the third sub-pixel 130 in the sub-pixel group 140 can have a relatively large area, which is advantageous for prolonging the life of the second sub-pixel 120 and the third sub-pixel 130, for example, in the AMOLED display device.

Figure 3:
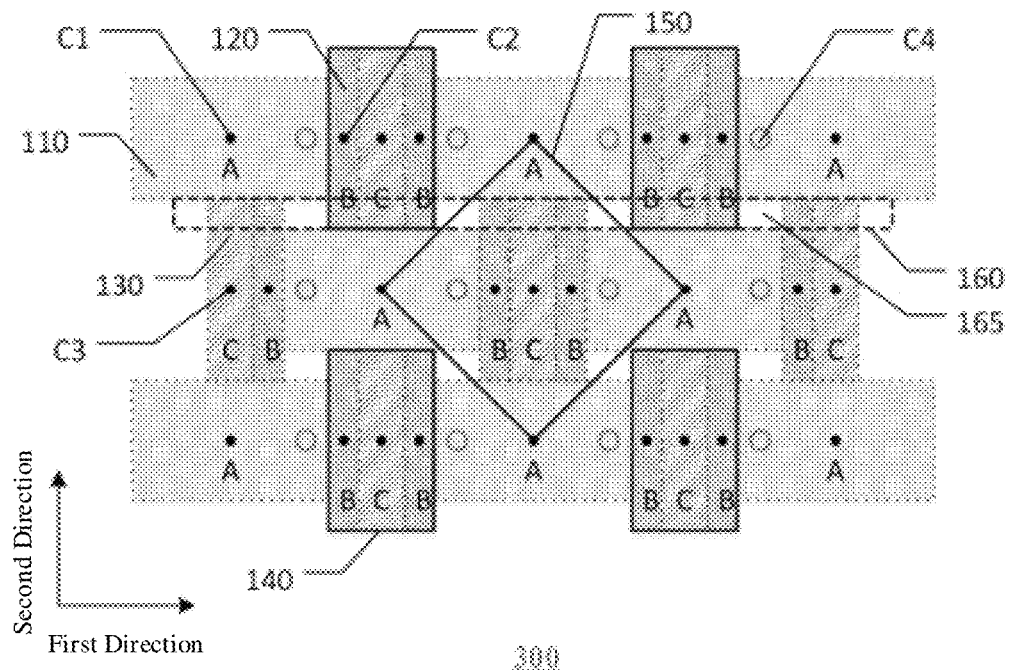
FIG. 3 is a schematic diagram of a pixel arrangement structure provided by another embodiment of the present disclosure.

For example, in some examples, the size of each first sub-pixel 110 in the second direction is ½-1 of the size of each sub-pixel group 140 in the second direction. For example, FIG. 2 shows a case where the size of the first sub-pixel 110 in the second direction is once the size of the sub-pixel group 140 in the second direction, that is, the size of the first sub-pixel 110 in the second direction is the same as the size of the sub-pixel group 140 in the second direction. FIG. 3 is a schematic diagram of a pixel arrangement structure provided by another embodiment of the present disclosure. Compared with FIG. 2, FIG. 3 shows a case where the ratio of the size of the first sub-pixel 110 in the second direction to the size of the sub-pixel group 140 in the second direction is between ½ and 1. In a case where the size of the sub-pixel group 140 in the second direction is greater than the size of the first sub-pixel 110 in the second direction, the areas of the second sub-pixel 120 and the third sub-pixel 130 can be further expanded to improve the service life of the second sub-pixel and the third sub-pixel. It should be noted that in a case where the size of the first sub-pixel 110 in the second direction is less than the size of the sub-pixel group 140 in the second direction, as shown in FIG. 3, a region 160 (shown by the dashed frame in FIG. 3) is formed in the pixel arrangement structure 300. The region 160 includes a part of the second sub-pixel 120 and a part of the third sub-pixel 130 and a void area 165. If the size of the region 160 in the second direction is too large, the display effect may be affected. Therefore, in order to avoid this problem, a ratio of the size of the first sub-pixel 110 in the second direction to the size of the sub-pixel group 140 in the second direction can be limited. For example, in the present embodiment, the ratio is ½-1.

It should be noted that the pixel arrangement structure 200 shown in FIG. 2 and the pixel arrangement structure 300 shown in FIG. 3 both show cases where the ratio of L2 to L1 is equal to ¼ (the distribution of the grayscale centers is approximately a strictly uniform distribution), but the embodiments of the present disclosure are not limited thereto. Due to the limited resolution of human eyes, the distribution of grayscale centers deviates slightly from the strictly uniform distribution shown in FIG. 2 and FIG. 3, and this will not be perceived by human eyes as long as the distribution of grayscale centers is more uniform than the distribution of grayscale centers shown in FIG. 1.

Figure 4:
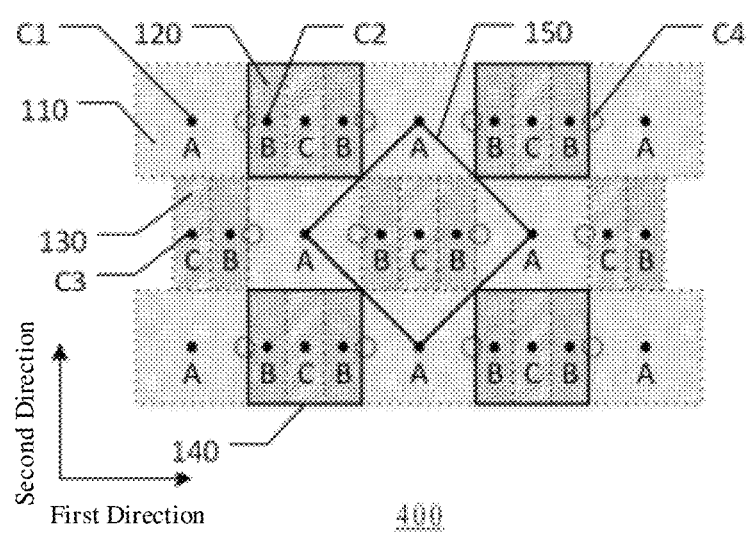
FIG. 4 is a schematic diagram of a pixel arrangement structure provided by further another embodiment of the present disclosure.

FIG. 4 is a schematic diagram of a pixel arrangement structure provided by further another embodiment of the present disclosure. As shown in FIG. 4, in the pixel arrangement structure 400, the ratio of L2 to L1 is greater than ¼ and less than ½, and the uniformity of the distribution of grayscale centers is poorer than that of the pixel arrangement structure 200 shown in FIG. 2, but is better than that of the pixel arrangement structure 100 shown in FIG. 1, thus still improving the uniformity of the distribution of the grayscale centers, improving the visual sense of graininess and non-smoothness, and further improving the display quality.

For example, in some examples, as shown in FIG. 4, in the pixel arrangement structure 400, the area of each first sub-pixel 110 is the same as the area of each sub-pixel group 140, and the area of each second sub-pixel 120 is the same as the area of each third sub-pixel 130. The area of the first sub-pixel 110 is the same as the area of the sub-pixel group 140, and compared with FIG. 2, the area of the first sub-pixel 110 is reduced and the area of the sub-pixel group 140 is increased, so that the area of the third sub-pixel 130 in the sub-pixel group 140 can be increased, and the service life of the third sub-pixel 130, for example, in the AMOLED display device, can be prolonged. The area of the second sub-pixel 120 and the area of the third sub-pixel 130 are the same, which can balance the objects of prolonging the service life of the third sub-pixel 130 and making the grayscale centers C4 more evenly distributed. In the pixel arrangement structure 400, if the area of the third sub-pixel 130 is increased, the service life of the third sub-pixel 130 will be prolonged, but the area of the second sub-pixel 120 will be reduced, and the geometric center C2 of the second sub-pixel 120 will be away from the geometric center C3 of the third sub-pixel 130, thus causing the grayscale center C4 to be closer to the geometric center C1 of the first sub-pixel 110, and further reducing the uniformity of the distribution of grayscale centers.

Figure 5:
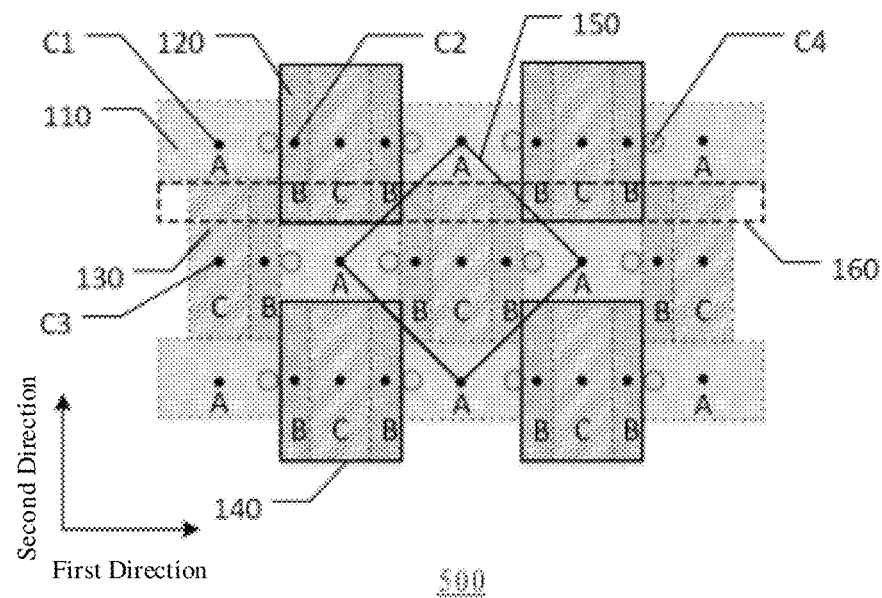
FIG. 5 is a schematic diagram of a pixel arrangement structure provided by still another embodiment of the present disclosure.

FIG. 5 is a schematic diagram of a pixel arrangement structure provided by still another embodiment of the present disclosure. As shown in FIG. 5, in the pixel arrangement structure 500, the ratio of L2 to L1 is greater than ¼ and less than ½, and the uniformity of the distribution of grayscales center is poorer than that of the pixel arrangement structure 300 shown in FIG. 3, but is better than that of the pixel arrangement structure 100 shown in FIG. 1, thus still improving the uniformity of the distribution of grayscale centers, improving the visual sense of graininess and non-smoothness, and further improving the display quality.

For example, in some examples, as shown in FIG. 5, in the pixel arrangement structure 500, the area of each first sub-pixel 110 is ½ of the area of each sub-pixel group 140, and the area of each third sub-pixel 130 is the same as the area of each first sub-pixel 110. Compared with the pixel arrangement structure 400 shown in FIG. 4, the pixel arrangement structure 500 shown in FIG. 5 enables the second sub-pixel 120 and the third sub-pixel 130 to have a larger area by increasing the size of the sub-pixel group 140 in the second direction, which is beneficial to prolonging the service life of the third sub-pixel 130. Compared with the pixel arrangement structure 300 shown in FIG. 3, the region 160 (shown by the dashed frame in FIG. 5) formed in the pixel arrangement structure 500 shown in FIG. 5 includes only a part of the second sub-pixel 120 and a part of the third sub-pixel 130, and no longer includes the void region 165, so that the aperture ratio of the entire pixel arrangement structure can be improved.

For example, in some examples, as shown in FIG. 5, in the pixel arrangement structure 500, the area of each second sub-pixel 120 is ½ of the area of each third sub-pixel 130. Therefore, the second sub-pixel 120 in the sub-pixel group 140 can definitely have a relatively large area, which is beneficial to prolonging the service life of the second sub-pixel 120, for example, in the AMOLED display device.

For example, in some examples, as shown in FIGS. 2-5, the first direction and the second direction are perpendicular to each other. Of course, the embodiments of the present disclosure include, but are not limited to, this case.

For example, in some examples, the first sub-pixel 110 includes a red sub-pixel, the second sub-pixel 120 includes a green sub-pixel, and the third sub-pixel 130 includes a blue sub-pixel. Of course, the display mode that can be adopted by the pixel arrangement structure provided by the embodiments of the present disclosure is not limited to the red, green and blue (RGB) mode described above, and other display modes can be referred to other commonly adopted schemes, which will not be described in the present disclosure.

It should be noted that in the embodiments of the present disclosure, the geometric center of each sub-pixel can be the barycenter of the planar geometry of each sub-pixel; the planar geometry of each sub-pixel can be a regular pattern (e.g., rectangles shown in FIGS. 2-5, etc.) or an irregular pattern. The present disclosure is not limited thereto as long as the distribution of the geometric centers of each sub-pixel meets the requirements of the embodiments of the present disclosure. It should be noted that each sub-pixel in the accompanying drawings can be regarded as including only a light emitting region, and can also be regarding as including both a light emitting region and a non-light emitting region, and the light emitting regions of adjacent sub-pixels are separated by the non-light emitting regions. For example, in some examples, the non-light emitting region includes a black matrix. Therefore, each sub-pixel in the accompanying drawings may not represent the area of the light emitting region thereof, and the area of the light emitting region of each sub-pixel may be smaller than the area of each sub-pixel. For example, in some examples, the light emitting region of each sub-pixel may be determined by the shape of at least one selected from the group consisting of the electrode, the light emitting layer, and the pixel defining layer. For example, for an OLED sub-pixel structure, the light emitting region of each sub-pixel may be the contacting region of the pixel electrode and the light emitting layer. The light emitting layer herein may include an electroluminescent layer and other organic functional layers such as an electron injecting layer, an electron transporting layer, a hole injecting layer, and a hole transporting layer. It should be noted that the geometric center of the light emitting region of each sub-pixel may coincide with the geometric center of each sub-pixel.

It should be noted that in a case where the pixel arrangement structure provided by the embodiments of the present disclosure is used in a display panel, it can be driven by a sub-pixel rendering algorithm. For example, a first sub-pixel and a second sub-pixel adjacent to each other form a virtual pixel, a second sub-pixel and a third sub-pixel adjacent to each other form a virtual pixel, and display is performed by means of sub-pixel borrowing.

Figure 6:
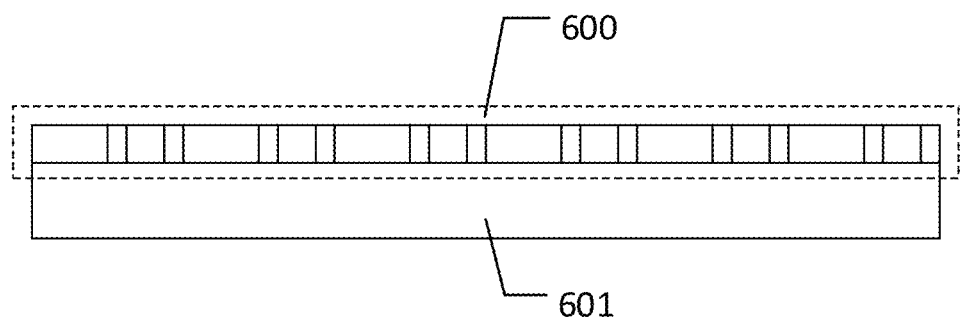
FIG. 6 is a schematic structural diagram of a display substrate provided by an embodiment of the present disclosure.

At least one embodiment of the present disclosure further provides a display substrate. FIG. 6 is a schematic structural diagram of a display substrate provided by an embodiment of the present disclosure. As shown in FIG. 6, the display substrate includes a base substrate 601 and a pixel arrangement structure 600 arranged on the base substrate 601. The pixel arrangement structure 600 can adopt the pixel arrangement structure provided by any one of the above examples. The display substrate adopts the pixel arrangement structure provided by any one of the above examples, so that the display substrate has the beneficial effects of the pixel arrangement structure included therein. For example, the display substrate can make the distribution of grayscale centers more uniform, improve the visual sense of graininess and non-smoothness, and thus improve the display quality.

Figure 7:
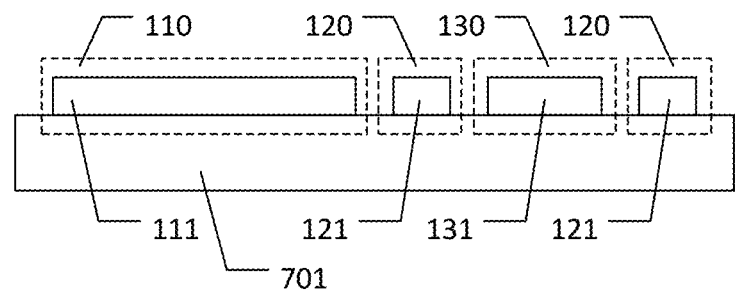
FIG. 7 is a schematic structural diagram of a display substrate provided by another embodiment of the present disclosure.

FIG. 7 is a schematic structural diagram of a display substrate provided by another embodiment of the present disclosure. As shown in FIG. 7, the display substrate includes a base substrate 701 and a pixel arrangement structure arranged on the base substrate 701. It should be noted that only part of the pixel arrangement structure is shown in FIG. 7. As shown in FIG. 7, in the pixel arrangement structure, the first sub-pixel 110 includes a first pixel electrode 111, the second sub-pixel 120 includes a second pixel electrode 121, and the third color sub-pixel 130 includes a third pixel electrode 131. The display substrate may be an array substrate, for example, the display substrate may be an AMOLED display substrate or an array substrate for liquid crystal display.

Figure 8:
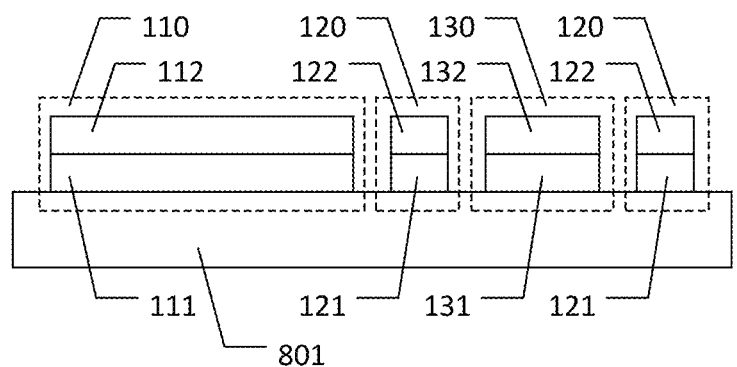
FIG. 8 is a schematic structural diagram of a display substrate provided by still another embodiment of the present disclosure.

FIG. 8 is a schematic structural diagram of a display substrate provided by still another embodiment of the present disclosure. As shown in FIG. 8, the display substrate includes a base substrate 801 and a pixel arrangement structure arranged on the base substrate 801. In this pixel arrangement structure, the first sub-pixel 110 includes not only a first pixel electrode 111 but also a first color light emitting layer 112 disposed on the first pixel electrode 111, the second sub-pixel 120 includes not only a second pixel electrode 121 but also a second color light emitting layer 122 disposed on the second pixel electrode 121, and the third color sub-pixel 130 includes not only a third pixel electrode 131 but also a third color light emitting layer 132 disposed on the third pixel electrode 131. Thus, the display substrate may be an array substrate, for example, the display substrate may be an AMOLED display substrate.

For example, in some examples, the first pixel electrode 111 is configured to drive the first color light emitting layer 112 to emit light.

For example, the shape of the first pixel electrode 111 can be the same as that of the first sub-pixel 110. Of course, the embodiments of the present disclosure include but are not limited to this case. The shape of the first pixel electrode 111 can be different from the shape of the first sub-pixel 110, and the shape of the light emitting region of the first sub-pixel 110 can be defined by a pixel defining layer.

It should be noted that the shape of the light emitting region of the first sub-pixel may be the same as or different from the shape of the first sub-pixel, and the area of the light emitting region of the first sub-pixel may be smaller than the area of the first sub-pixel. In addition, the specific shape of the first color light emitting layer can be set according to the manufacturing process, which is not limited in the embodiments of the present disclosure.

For example, in some examples, the second pixel electrode 121 is configured to drive the second color light emitting layer 122 to emit light.

For example, the shape of the second pixel electrode 121 can be the same as that of the second sub-pixel 120. Of course, the embodiments of the present disclosure include but are not limited to this case. The shape of the second pixel electrode 121 can be different from the shape of the second sub-pixel 120, and the shape of the light emitting region of the second sub-pixel 120 can be defined by a pixel defining layer.

It should be noted that the shape of the light emitting region of the second sub-pixel may be the same as or different from the shape of the second sub-pixel, and the area of the light emitting region of the second sub-pixel may be smaller than the area of the second sub-pixel. In addition, the specific shape of the second color light emitting layer can be set according to the manufacturing process, which is not limited in the embodiments of the present disclosure.

For example, in some examples, the third pixel electrode 131 is configured to drive the third color light emitting layer 132 to emit light.

For example, the shape of the third pixel electrode 131 can be the same as that of the third sub-pixel 130. Of course, the embodiments of the present disclosure include but are not limited to this case. The shape of the third pixel electrode 131 can be different from the shape of the third sub-pixel 130, and the shape of the light emitting region of the third sub-pixel 130 can be defined by a pixel defining layer.

It should be noted that the shape of the light emitting region of the third sub-pixel may be the same as or different from the shape of the third sub-pixel, and the area of the light emitting region of the third sub-pixel may be smaller than the area of the third sub-pixel. In addition, the specific shape of the third color light emitting layer can be set according to the manufacturing process, which is not limited in the embodiments of the present disclosure.

Figure 9:
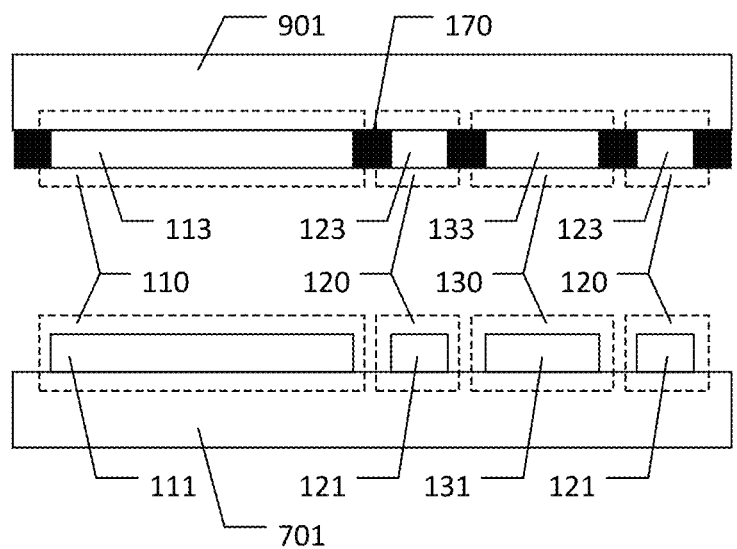
FIG. 9 is a schematic structural diagram of a display panel provided by an embodiment of the present disclosure.

FIG. 9 is a schematic structural diagram of a display panel provided by an embodiment of the present disclosure. As shown in FIG. 9, the display panel includes not only the base substrate 701 on which a pixel arrangement structure is arranged as shown in FIG. 7, but also a color filter substrate 901 on which a pixel arrangement structure is arranged, and the pixel arrangement structure on the color filter substrate 901 is arranged in the same manner as the pixel arrangement structure on the base substrate 701. It should be noted that only part of the pixel arrangement structure is shown in FIG. 9.

For example, in some embodiments, the display substrate provided by the embodiments of the present disclosure includes a color filter substrate, for example, the color filter substrate is the color filter substrate 901 in FIG. 9. For example, as shown in FIG. 9, the first sub-pixel 110 on the color filter substrate 901 includes a first color filter layer 113, the second sub-pixel 120 on the color filter substrate 901 includes a second color filter layer 123, and the third sub-pixel 130 on the color filter substrate 901 includes a third color filter layer 133.

It should be noted that the display panel shown in FIG. 9 can be used not only for a liquid crystal display panel, but also for a display panel in a manner that combine white light OLED with color filter substrate. For example, in a case where the display panel is a liquid crystal display panel, a liquid crystal layer may also be included between the base substrate 701 and the color filter substrate 901.

For example, in some examples, as shown in FIG. 9, the color filter substrate 901 in the display panel further includes a black matrix 170 disposed between the first color filter layer 113, the second color filter layer 123, and the third color filter layer 133.

It should be noted that in the embodiments of the present disclosure, the first sub-pixel, the second sub-pixel and the third sub-pixel in the pixel arrangement structure may include at least part of the pixel structure that realizes the pixel function, and the specific type and structure of the sub-pixels are not particularly limited. For example, each sub-pixel may be an OLED light emitting element or a liquid crystal display pixel, which may include at least one selected from the group consisting of a pixel electrode, a light emitting layer, and a color filter layer. For example, the display substrate including the pixel arrangement structure in the embodiments of the present disclosure may be any one of an OLED display substrate, a color filter substrate and an array substrate for liquid crystal display.

It should be noted that, for the sake of clarity, not all structures of the display panel are shown in the embodiments shown in the accompanying drawings of the present disclosure. In order to realize the necessary functions of the display panel, those skilled in the art may set other structures not shown according to actual needs, which are not limited in the present disclosure.

At least one embodiment of the present disclosure further provides a display device. The display device includes any one of the display substrates provided by the above embodiments. Therefore, the display device can make the distribution of grayscale centers more uniform, thereby improving the visual sense of graininess and non-smoothness, and further improving the display quality.

For example, in some examples, the display device may be any product or component having display function, such as a smart phone, a tablet computer, a television, a display, a notebook computer, a digital photo frame, a navigator, etc. The display device may also include other conventional components, which are not limited in the embodiments of the present disclosure.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, features in one embodiment or in different embodiments of the present disclosure can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A pixel arrangement structure, comprising: a plurality of first sub-pixels and a plurality of sub-pixel groups arranged in an array, wherein the plurality of first sub-pixels and the plurality of sub-pixel groups are alternately arranged along a first direction to form pixel rows, and are alternately arranged along a second direction intersected with the first direction to form pixel columns;

each of the plurality of sub-pixel groups comprises a second sub-pixel, a third sub-pixel and another second sub-pixel sequentially arranged along the first direction;

geometric centers of first sub-pixels, second sub-pixels and third sub-pixels in a same pixel row are located on a same straight line along the first direction;

geometric centers of first sub-pixels and third sub-pixels in a same pixel column are located on a same straight line along the second direction; and for a selected first pixel and a selected sub-pixel group adjacent to the selected first pixel in the same pixel row, a distance between geometric centers of one second sub-pixel in the selected sub-pixel group and a third sub-pixel in the selected sub-pixel group is a first distance along the first direction, a distance between geometric centers of the other second sub-pixel in the selected sub-pixel group and the third sub-pixel in the selected sub-pixel group is a second distance along the first direction, a distance between geometric centers of the selected first pixel and the third sub-pixel in the selected sub-pixel group is a third distance along the first direction, a ratio of the first distance to the third distance is greater than or equal to ¼ and less than ½, and a ratio of the second distance to the third distance is greater than or equal to ¼ and less than ½.

2. The pixel arrangement structure according to claim 1, wherein geometric centers of four first sub-pixels adjacent to each of the plurality of sub-pixel groups are four vertices of a square or a quasi-square shape.

3. The pixel arrangement structure according to claim 2, wherein a size of each of the third sub-pixels in the first direction is ⅓-½ of a size of each of the plurality of sub-pixel groups in the first direction.

4. The pixel arrangement structure according to claim 3, wherein a size of each of the second sub-pixels in the second direction is the same as a size of each of the third sub-pixels in the second direction.

5. The pixel arrangement structure according to claim 3, wherein a size of each of the plurality of first sub-pixels in the second direction is ½-1 of a size of each of the plurality of sub-pixel groups in the second direction.

6. The pixel arrangement structure according to claim 5, wherein an area of each of the plurality of first sub-pixels is the same as an area of each of the plurality of sub-pixel groups, and an area of each of the second sub-pixels is the same as an area of each of the third sub-pixels.

7. The pixel arrangement structure according to claim 5, wherein an area of each of the plurality of first sub-pixels is ½ of an area of each of the plurality of sub-pixel groups, and an area of each of the third sub-pixels is the same as the area of each of the plurality of first sub-pixels.

8. The pixel arrangement structure according to claim 7, wherein an area of each of the second sub-pixels is ½ of the area of each of the third sub-pixels.

9. The pixel arrangement structure according to claim 1, wherein the first direction and the second direction are perpendicular to each other.

10. The pixel arrangement structure according to claim 9, wherein shapes of the first sub-pixel, the second sub-pixel, and the third sub-pixel are all rectangular.

11. The pixel arrangement structure according to claim 1, wherein each of the first sub-pixels comprises a red sub-pixel, each of the second sub-pixels comprises a green sub-pixel, and each of the third sub-pixels comprises a blue sub-pixel.

12. A display substrate, comprising:
a base substrate; and
a pixel arrangement structure arranged on the base substrate, wherein the pixel arrangement structure comprises the pixel arrangement structure according to claim 1.

13. The display substrate according to claim 12, wherein each of the first sub-pixels comprises a first pixel electrode, each of the second sub-pixels comprises a second pixel electrode, and each of the third sub-pixels comprises a third pixel electrode.

14. The display substrate according to claim 13, wherein each of the first sub-pixels further comprises a first color light emitting layer disposed on the first pixel electrode, each of the second sub-pixels further comprises a second color light emitting layer disposed on the second pixel electrode, and each of the third sub-pixels further comprises a third color light emitting layer disposed on the third pixel electrode.

15. The display substrate according to claim 12, wherein the display substrate is a color filter substrate, each of the first sub-pixels comprises a first color filter layer, each of the second sub-pixels comprises a second color filter layer, and each of the third sub-pixels comprises a third color filter layer.

16. A display device, comprising the display substrate according to claim 12.

* * * * *